US009349725B2

(12) United States Patent
Sugiura et al.

(10) Patent No.: US 9,349,725 B2
(45) Date of Patent: May 24, 2016

(54) STRIPE ORIENTATION FOR TRENCHES AND CONTACT WINDOWS

(71) Applicant: Icemos Technology Ltd., Belfast (GB)

(72) Inventors: Kenji Sugiura, Kanagawa-ken (JP); Takeshi Ishiguro, Fukushima-ken (JP)

(73) Assignee: Michael W. Shore, Dallas, TX (US)

(*) Notice: Subject to any disclaimer, the term of this patent is extended or adjusted under 35 U.S.C. 154(b) by 0 days.

(21) Appl. No.: 14/209,653

(22) Filed: Mar. 13, 2014

(65) Prior Publication Data

US 2014/0264620 A1 Sep. 18, 2014

Related U.S. Application Data

(60) Provisional application No. 61/778,940, filed on Mar. 13, 2013.

(51) Int. Cl.
| H01L 29/66 | (2006.01) |
| H01L 27/088 | (2006.01) |
| H01L 29/78 | (2006.01) |
| H01L 29/06 | (2006.01) |
| H01L 29/417 | (2006.01) |
| H01L 29/10 | (2006.01) |

(52) U.S. Cl.
CPC .......... *H01L 27/088* (2013.01); *H01L 29/0634* (2013.01); *H01L 29/0653* (2013.01); *H01L 29/41741* (2013.01); *H01L 29/7802* (2013.01); *H01L 29/1095* (2013.01)

(58) Field of Classification Search
CPC ............ H01L 29/0653; H01L 29/0696; H01L 27/088; H01L 29/66704; H01L 29/7823; H01L 29/66712; H01L 29/7811; H01L 29/0878; H01L 29/7813; H01L 29/0634; H01L 21/26586; Y04S 30/12; Y02T 90/168
See application file for complete search history.

(56) References Cited

U.S. PATENT DOCUMENTS

| 6,291,856 | B1 * | 9/2001 | Miyasaka et al. | 257/335 |
| 6,600,194 | B2 * | 7/2003 | Hueting et al. | 257/331 |
| 7,238,576 | B2 * | 7/2007 | Yamaguchi et al. | 438/268 |
| 8,159,039 | B2 * | 4/2012 | Cheng | 257/506 |
| 2002/0070418 | A1 * | 6/2002 | Kinzer et al. | 257/496 |
| 2006/0197152 | A1 * | 9/2006 | Tokano et al. | 257/341 |
| 2008/0185643 | A1 * | 8/2008 | Hossain | 257/342 |
| 2008/0258239 | A1 * | 10/2008 | Ishiguro | 257/397 |
| 2013/0320443 | A1 * | 12/2013 | Levin et al. | 257/337 |
| 2014/0264620 | A1 * | 9/2014 | Sugiura et al. | 257/368 |

* cited by examiner

Primary Examiner — Jarrett Stark
Assistant Examiner — Bitew Dinke
(74) Attorney, Agent, or Firm — Panitch Schwarze Belisario & Nadel LLP

(57) ABSTRACT

A semiconductor device includes a semiconductor layer having first and second main surfaces, with the first surface defining a plane containing first and second perpendicular axes. A first gate is disposed proximate the first main surface and extends parallel to the first axis. A dielectric layer is formed on the first main surface and separates the first gate from the first main surface. First and second trenches are formed in the semiconductor layer proximate the first gate and spaced apart in a direction parallel to the first axis. First and second pluralities of contact windows are formed in the dielectric layer to expose the first main surface and are respectively arranged in first and second rows extending between the first and second trenches in a direction parallel to the first axis. Adjacent contact windows in each first row are separated only by the dielectric layer.

19 Claims, 6 Drawing Sheets

STRIPE ORIENTATION FOR TRENCHES AND CONTACT WINDOWS

CROSS-REFERENCE TO RELATED APPLICATIONS

This application claims the benefit of U.S. Provisional Patent Application No. 61/778,940, filed on Mar. 13, 2013, entitled "STRIPE ORIENTATION FOR TRENCHES AND CONTACT WINDOWS," the entire contents of which are incorporated by reference herein.

BACKGROUND OF THE INVENTION

Embodiments of the present invention relate generally to semiconductor devices, and more particularly, to semiconductor devices having a striped orientation of trenches and contact windows.

Since the invention of superjunction devices by Dr. Xingbi Chen, as disclosed in U.S. Pat. No. 5,216,275, the contents of which are incorporated by reference herein, there have been many attempts to expand and improve on the superjunction effect of his invention. U.S. Pat. Nos. 6,410,958, 6,300,171 and 6,307,246 are examples of such efforts and are incorporated herein by reference.

Superjunction devices, including, but not limited to metal-oxide-semiconductor field-effect transistors (MOSFET), diodes, and insulated-gate bipolar transistors (IGBT), have been or will be employed in various applications such as automobile electrical systems, power supplies, and power management applications. For example, superjunction devices may specifically be employed in light emitting diode (LED) televisions, electric or hybrid cars, LED light bulbs, servers, tablets, uninterruptable power supplies (UPS), and the like. Such devices sustain high voltages in the off-state and yield low voltages and high saturation current densities in the on-state.

FIGS. 1 and 2 show a conventional arrangement for a semiconductor device 10. A semiconductor substrate 12 supports a semiconductor layer 14 with a plurality of trenches 16 formed in a first main surface 14a of the semiconductor layer 14. First and second doped regions 18, 20, typically source/drain and body contact regions, respectively, are formed proximate the first main surface 14a. A layer of dielectric material 22 is formed over the first main surface 14a of the semiconductor layer 14 which isolates a gate 24 from the semiconductor layer 14. A plurality of contact windows 26 are formed in the dielectric layer 22 to expose the first and second doped regions 18, 20 such that a later formed metal contact 28 can be electrically and preferably physically coupled to the first and second doped regions 18, 20. In this conventional structure, as best seen in FIG. 1, the trenches 16 are arranged in a grid pattern of rows and columns. Closely surrounding a periphery of each trench 16 is a cluster of contact windows 26.

It is desirable to provide a semiconductor device with reduced cell sizes and higher cell densities, a lower on-resistance, and a lower gate charge.

BRIEF SUMMARY OF THE INVENTION

Briefly stated, an embodiment of the present invention comprises a semiconductor device including a semiconductor layer having a first main surface and an opposing second main surface. The first main surface defines a plane containing a first axis and a second axis perpendicular to the first axis. A first gate is disposed proximate the first main surface of the semiconductor layer and extends parallel to the first axis. A dielectric layer is formed on the first main surface of the semiconductor layer and separates the first gate from the first main surface of the semiconductor layer. A first trench is formed in the semiconductor layer proximate the first gate and extends from the first main surface of the semiconductor layer toward the second main surface of the semiconductor layer. A second trench is formed in the semiconductor layer proximate the first gate and extends from the first main surface of the semiconductor layer toward the second main surface of the semiconductor layer. The first and second trenches are spaced apart from one another in a direction parallel to the first axis. A first plurality of contact windows is formed in the dielectric layer and arranged in a first row extending between the first and second trenches in a direction parallel to the first axis. Adjacent contact windows in the first row are separated from one another only by the dielectric layer. Each of the first plurality of contact windows exposes a portion of the first main surface of the semiconductor layer. A second plurality of contact windows are formed in the dielectric layer and arranged in a second row extending between the first and second trenches parallel to the first row. Adjacent contact windows in the second row are separated only by the dielectric layer. Each of the second plurality of contact windows exposes a portion of the first main surface of the semiconductor layer.

Another embodiment of the present invention comprises a semiconductor device including a semiconductor layer having a first main surface and an opposing second main surface. The first main surface defines a plane containing a first axis and a second axis perpendicular to the first axis. A plurality of gates are disposed proximate the first main surface of the semiconductor layer and extend in the first axis. A dielectric layer is formed on the first main surface of the semiconductor layer and separates the plurality of gates from the first main surface of the semiconductor layer. Between each of adjacent ones of the plurality of gates a plurality of trenches are formed in the semiconductor layer extending from the first main surface of the semiconductor layer toward the second main surface of the semiconductor layer. Each of the plurality of trenches is spaced apart from adjacent ones of the plurality of trenches in a direction parallel to the first axis. A plurality of contact windows are formed in the dielectric layer and arranged in two parallel rows extending between each of adjacent ones of the plurality of trenches in a direction parallel to the first axis. Each of the plurality of contact windows is separated from adjacent ones of the plurality of contact windows only by the dielectric layer. Each of the plurality of contact windows exposes a portion of the first main surface of the semiconductor layer.

BRIEF DESCRIPTION OF THE DRAWINGS

The foregoing summary, as well as the following detailed description of preferred embodiments of the invention, will be better understood when read in conjunction with the appended drawings. For the purpose of illustration, there are shown in the drawings embodiments which are presently preferred. It should be understood, however, that the invention is not limited to the precise arrangements and instrumentalities shown.

DETAILED DESCRIPTION OF THE INVENTION

Figure 1:
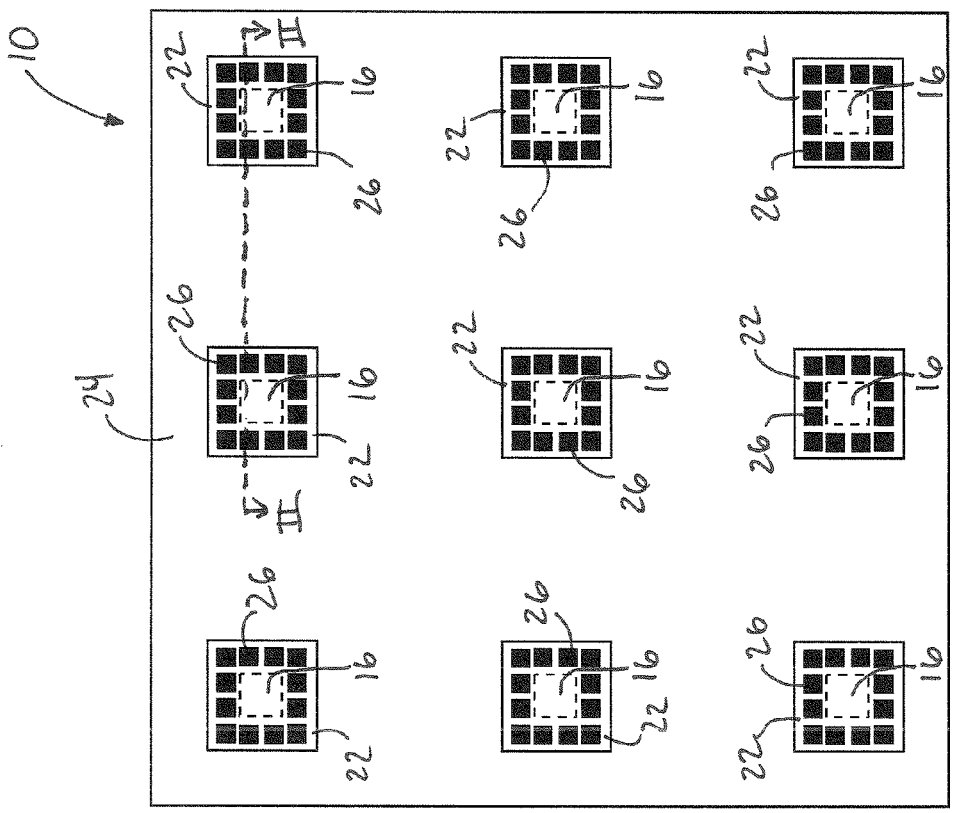
FIG. 1 is an enlarged partial top plan view of a partially completed conventional semiconductor device.
Figure 2:
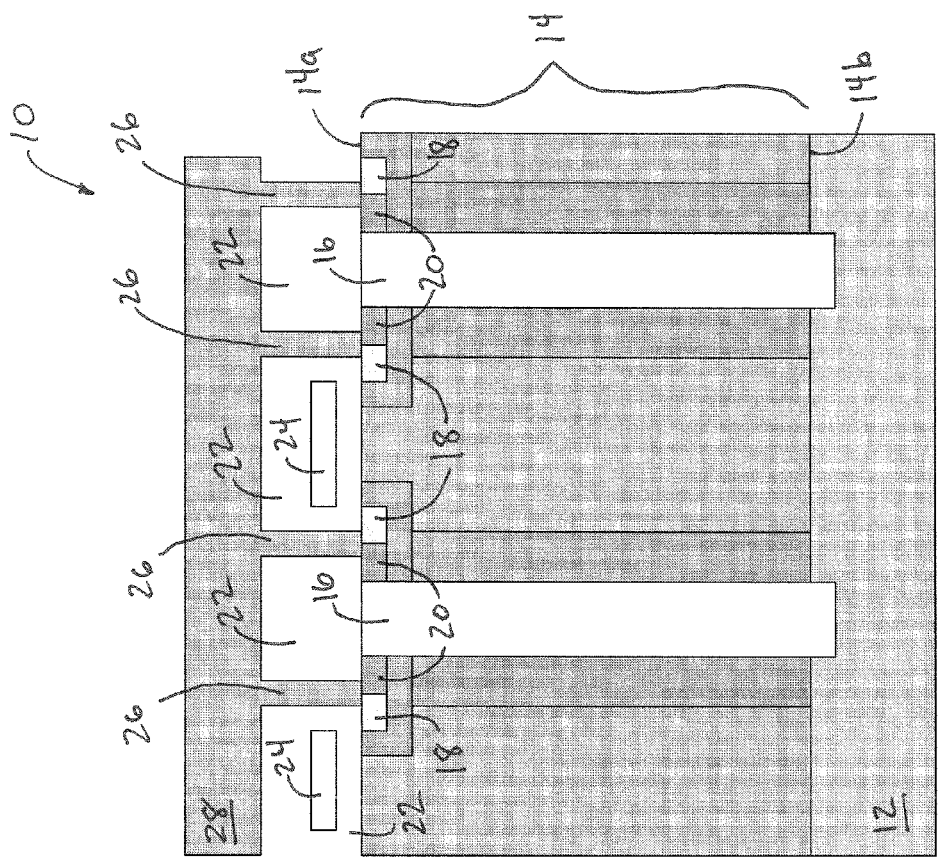
FIG. 2 is an enlarged partial cross-sectional elevational view, taken along line II-II, of the semiconductor device of FIG. 1 with remaining dielectric layer and metal contact formed thereon.

Certain terminology is used in the following description for convenience only and is not limiting. The words "right", "left", "lower", and "upper" designate directions in the drawings to which reference is made. The words "inwardly" and "outwardly" refer to directions toward and away from, respectively, the geometric center of the semiconductor device and designated parts thereof. The terminology includes the above-listed words, derivatives thereof, and words of similar import. Additionally, the words "a" and "an", as used in the claims and in the corresponding portions of the specification, mean "at least one."

As used herein, reference to conductivity will be limited to the embodiment described. However, those skilled in the art know that p-type conductivity can be switched with n-type conductivity and the device would still be functionally correct (i.e., a first or a second conductivity type). Therefore, where used herein, reference to n or p can also mean either n or p or p and n can be substituted therefor.

Furthermore, $n^+$ and $p^+$ refer to heavily doped n and p regions, respectively; $n^{++}$ and $p^{++}$ refer to very heavily doped $n^-$ and $p^-$ regions, respectively; $n^-$ and $p^-$ refer to lightly doped n and p regions, respectively; and $n^{--}$ and $p^{--}$ refer to very lightly doped n and p regions, respectively. However, such relative doping terms should not be construed as limiting.

Figure 3:
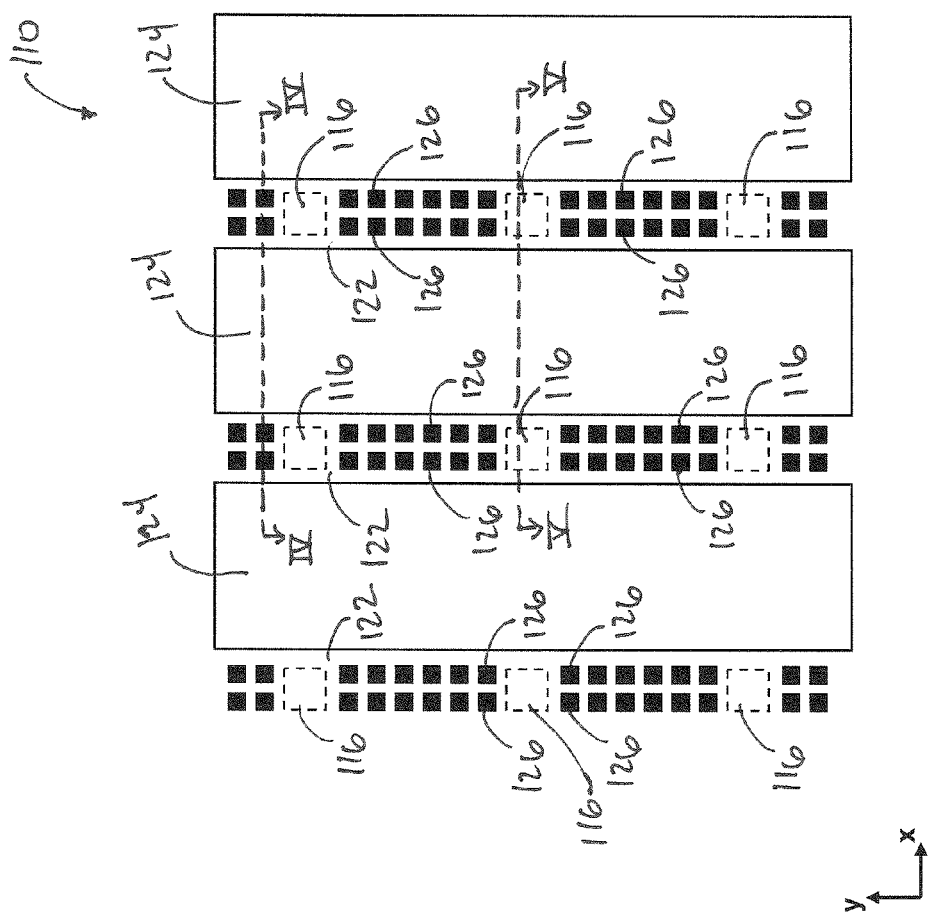
FIG. 3 is an enlarged partial top plan view of a partially completed semiconductor device in accordance with a first preferred embodiment of the present invention.
Figure 5:
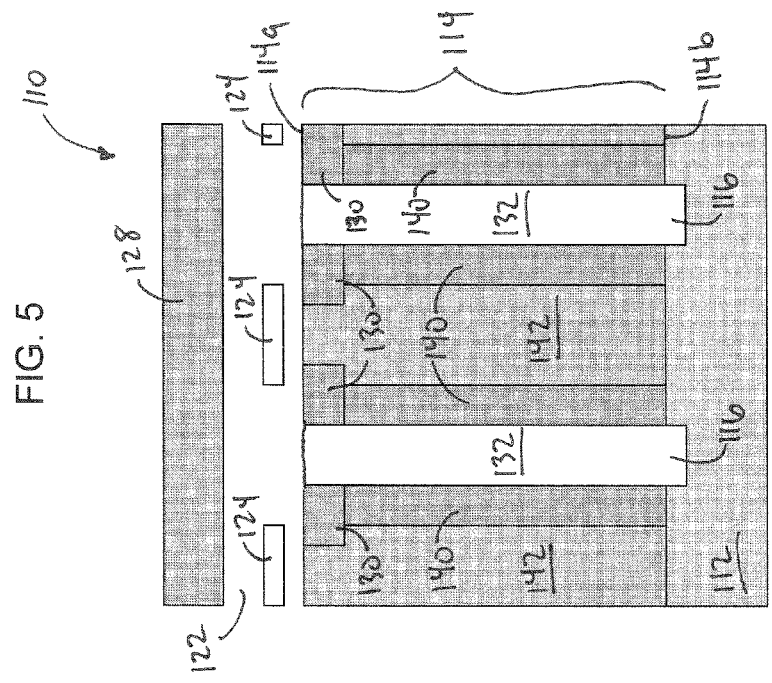
FIG. 5 is an enlarged partial cross-sectional elevational view, taken along line V-V, of the semiconductor device of FIG. 3 with remaining dielectric layer and metal contact formed thereon.
Figure 4:
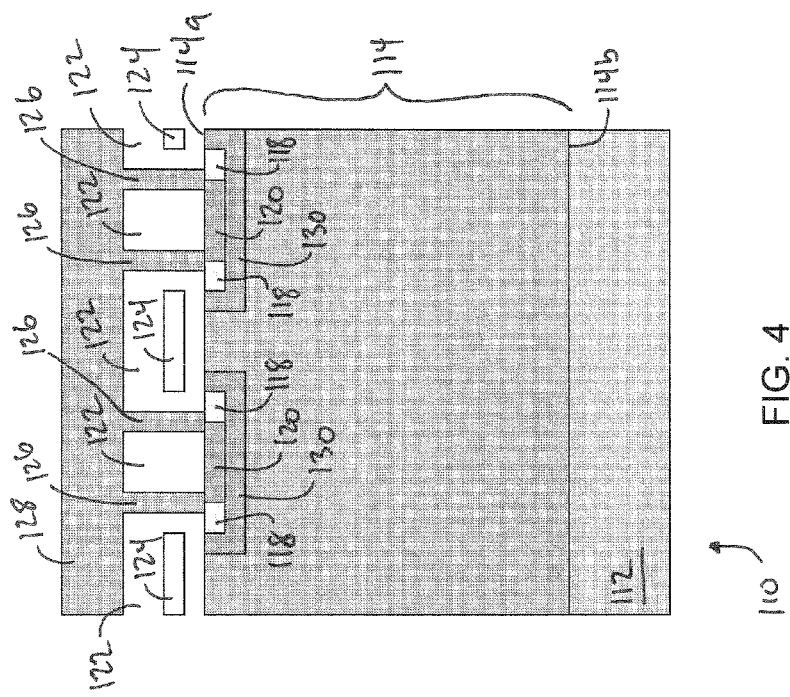
FIG. 4 is an enlarged partial cross-sectional elevational view, taken along line IV-IV, of the semiconductor device of FIG. 3 with remaining dielectric layer and metal contact formed thereon.

Referring to the drawings in detail, wherein like reference numerals indicate like elements throughout, there is shown in FIG. 3 an enlarged partial top plan view of a partially-completed semiconductor device 10. Rather than having a matrix configuration as shown in FIG. 1, the embodiment shown in FIG. 3 demonstrates gates 124 according to embodiments of the present invention have a "stripe" form. A semiconductor layer 114 includes a first main surface 114a and a second main surface 114b (FIGS. 4 and 5). The first main surface 114a defines a plane containing a first axis (e.g., "y" axis) and a second axis (e.g., "x" axis). The gates 124 preferably extend proximate the first main surface 114a of the semiconductor layer 114 parallel to the "y" axis. A dielectric layer 122 separates the gates 124 from the first main surface 114a of the semiconductor layer 114.

A plurality of trenches 116 formed in the semiconductor layer 114 are located between each of the adjacent gates 124 spaced apart from one another, essentially forming rows of trenches 116, each of which extends in a direction parallel to the "y" axis. The trenches 116 are shown in FIG. 3 as having a generally square cross-section, but other shapes may be used, such as circles, ovals, rectangles, dog-bones, or the like. Between adjacent trenches 116 in the "y" direction, two parallel rows of contact windows 126 are formed in the dielectric layer 122. Contact windows 126 are separated from adjacent contact windows 126 in the same row (and from adjacent trenches 116) only by the dielectric layer 122 (i.e., the gate 124 does not intercede between two contact windows 126 in the "y" direction). Accordingly, an alternating pattern is formed of gates 124 and stripes including trenches 116 and contact windows 126.

The effect of this configuration is seen in FIGS. 4 and 5. FIG. 4 is a cross-section taken along line IV-IV in the "x" direction in FIG. 3. A pair of contact windows 126 is located between each pair of gates 124. Each of the contact windows 126 exposes, through the dielectric layer 122, a portion of the first main surface 114a of the semiconductor layer 114. Preferably, first and second doped regions (e.g., source/drain region 118 and body contact region 120) are formed proximate the first main surface 114a of the semiconductor layer 114 in the vicinity of the contact windows 126. In this way, one or both of the doped regions 118, 120 may be exposed by the contact windows 126. The body contact region 120 is preferably heavily doped with a dopant of a first conductivity type (e.g., p-type) while the source/drain region 118 is preferably heavily doped with a dopant of the opposite, second conductivity type (e.g., n-type). Preferably, the source/drain region 118 and the body contact region 120 are surrounded by a third doped region (e.g., body region 130), which is of the first conductivity type, having a lesser dopant concentration than the body region 120.

A metal contact 128 is formed on the dielectric layer 122 opposite the first main surface 114a of the semiconductor layer 114. The metal contact 128 extends into the contact windows 126 to connect with the source/drain region 118 and the body contact region 120 at the first main surface 114a of the semiconductor layer 114.

The second main surface 114b of the semiconductor layer 114 is preferably disposed on a semiconductor substrate 112. The substrate 112 is preferably heavily doped with a dopant of the second conductivity type (e.g., $n^+$ or $n^{++}$). By contrast, the semiconductor layer 114 has a lighter doping concentration of a dopant of the second conductivity type (e.g., n or $n^-$). The substrate 112 is preferably formed of silicon (Si), but may be formed of other materials such as gallium arsenide (GaAs), germanium (Ge) or the like.

In preferred embodiments, the semiconductor layer 114 is epitaxially grown on a surface of the semiconductor substrate 112. The epitaxial growth or deposition may occur in a suitable reaction chamber at a temperature of up to about 1200° C. Other methods for forming the semiconductor layer 114 on the substrate 112, such as by bonding, annealing, and the like, may be used.

FIG. 5 is a cross-section taken along line V-V also in the "x" direction in FIG. 3. For clarity, line V-V bisects trenches 116 rather than contact windows 126. As can be seen in FIG. 5, the trenches 116 extend from the first main surface 114a of the semiconductor layer 114 toward the second main surface 114b. In preferred embodiments, the trenches 116 extend past the second main surface 114b and at least partially into the semiconductor substrate 112. However, the depth of the trenches 116 is not so limited, and any desirable depth may be utilized in keeping with the spirit of the present invention.

The trenches 116 are preferably etched using deep reactive ion etching (DRIE). DRIE utilizes an ionized gas, or plasma, such as, for example, sulfur hexafluoride ($SF_6$), to remove material from the semiconductor layer 114. DRIE technology permits the formation of deeper trenches 116 with straighter sidewalls than other known techniques. Other techniques for forming the trenches 116 can be used, however, such as plasma etching, reactive ion etching (RIE), sputter etching, vapor phase etching, chemical etching, or the like.

To form the trenches 116, preferably a mask (not shown) is selectively applied over the first main surface 114a of the semiconductor layer 114. The mask may be created by deposition of a layer of photoresist or in some other manner well known to those skilled in the art. The developed photoresist is removed and undeveloped photoresist remains in place as is known in the art. For simplification, the mask refers to the material used to prevent certain areas of a semiconductor from being etched, doped, coated or the like. In certain embodiments, a thin layer of oxide or other dielectric material (not shown) may be applied to the first main surface 114a prior to application of the mask. The trenches 116 are formed in the areas not covered by the mask. After the trenching process, the mask is removed using techniques known in the art.

The sidewalls of each trench 116 can be smoothed, if needed, using, for example, one or more of the following process steps: (i) an isotropic plasma etch may be used to remove a thin layer of silicon (typically 100-1000 Angstroms) from the trench surfaces or (ii) a sacrificial silicon dioxide layer may be grown on the surfaces of the trench and then removed using an etch such as a buffered oxide etch or a diluted hydrofluoric (HF) acid etch. The use of the smoothing techniques can produce smooth trench surfaces with rounded corners while removing residual stress and unwanted contaminates. However, in embodiments where it is desirable to have vertical sidewalls and square corners, an anisotropic etch process will be used instead of the isotropic etch process discussed above. Anisotropic etching, in contrast to isotropic etching, generally means different etch rates in different directions in the material being etched.

The trenches 116 may be filled with one of a semi-insulating or insulating material 132, as will be described more fully below. The refill material 132 may or may not be identical to the dielectric material 122 used to isolate the gates 124. In exemplary embodiments, the refill material 132 can be a polysilicon, a re-crystallized polysilicon, a single crystal silicon, Tetraethylorthosilicate (TEOS), or a semi-insulating polycrystalline silicon (SIPOS), filled into the trenches 116 using a spun-on-glass (SOG) technique. The trenches 116 may also be refilled using other techniques, such as low pressure (LP) chemical vapor deposition (CVD), or any other oxide deposition technique as is known in the art. The trenches 116 can be filled by a reflow process or the like.

Between adjacent trenches 116 in the "x" direction, and beneath the gates 124, first columns 140 of the first conductivity type (e.g., p-type) are formed extending along sidewalls of the trenches 116 between the first and second main surfaces 114a, 114b of the semiconductor layer 114. In preferred embodiments, each first column 140 extends from the adjacent body region 130 at the first main surface 114a of the semiconductor layer 114 to the second main surface 114b. A second column 142 of the second conductivity type (e.g., n-type) is disposed between adjacent first columns 140. Thus, a p-n-p (or n-p-n) column structure is formed.

The first and second columns 140, 142 may be formed by implantation of appropriate dopants, which may occur at predetermined angles. The implantation angles are determined by the width of the trenches 116 and the desired doping depth, and is typically from about 2° to 12° (−2° to −12°) from vertical. The implant is done at angles so that the bottom of each trench 116 is not implanted. Preferably, the implantation occurs at least partially between the first main surface 114a and the second main surface 114b of the semiconductor layer 114. The implant is performed at an energy level of about 30-200 kilo-electron-Volts (KeV) with dose ranges from about 1E13 to 1E14 $cm^{-2}$ (i.e., about $1\times10^{13}$ to $1\times10^{14}\,cm^{-2}$). Typically, a dopant of the second conductivity type (e.g., n-type) is implanted into the sidewall surfaces of the trenches 116 to form n-type doped regions having a doping concentration lower than that of the heavily doped substrate 112. The doping preferably occurs with the aid of a mask (not shown) placed over the first main surface 114a of the semiconductor layer 114.

The doping is performed by one of ion implantation, solid diffusion, liquid diffusion, spin-on deposits, plasma doping, vapor phase doping, laser doping, or the like. Doping with boron B results in a more p-type region, doping with phosphorus P results in a more n-type region and doping with arsenic Ar results in a more n-type region. Other dopants may be utilized such as antimony Sb, bismuth Bi, aluminum Al, indium In, gallium Ga or the like depending on the material of the substrate and the desired strength of the doping. Preferably, the doping is performed by ion implantation.

Following implanting, a drive in step at a temperature of up to 1200° Celsius may be performed for up to 12 hours. It should be recognized that the temperature and time are selected to sufficiently drive in the implanted dopant. But, the energy level used to perform ion implantation, as described above, may be high enough to sufficiently drive in the dopants without departing from the present invention.

Following implantation and driving of the n-type dopant, a similar doping step occurs with respect to the sidewalls of the trenches 116, but with a dopant of the opposite conductivity type (e.g., p-type). Drive-in of the two dopants may occur after each implantation step, or simultaneously. The result is the formation of the first and second columns 140, 142.

The body regions 130 are doped with a first conductivity (e.g., p-type), and can be formed before, during, or subsequent to formation of the first columns 140. The body regions 130 may be formed by doping techniques described above, wherein the ion implantation takes place at the trench 116 sidewall and/or the first main surface 114a of the semiconductor layer 114 with appropriate masking, drive-in steps, and the like. The source/drain and body contact regions 118, 120 may also be formed through ion implantation of the first main surface 114a or other doping methods as are known.

The dielectric layer 122 may be formed on the first main surface 114a of the semiconductor layer 114 using known methods of dielectric deposition. The contact windows 126 are preferably formed using known masking and etching techniques. The gates 124 are preferably formed of a doped polysilicon, but may also be composed of, for example, a metal, an amorphous silicon, or a combination thereof, and formed by conventional techniques. The metal contact 128 is preferably formed on the completed dielectric layer 122 using known metal deposition techniques.

Figure 6:
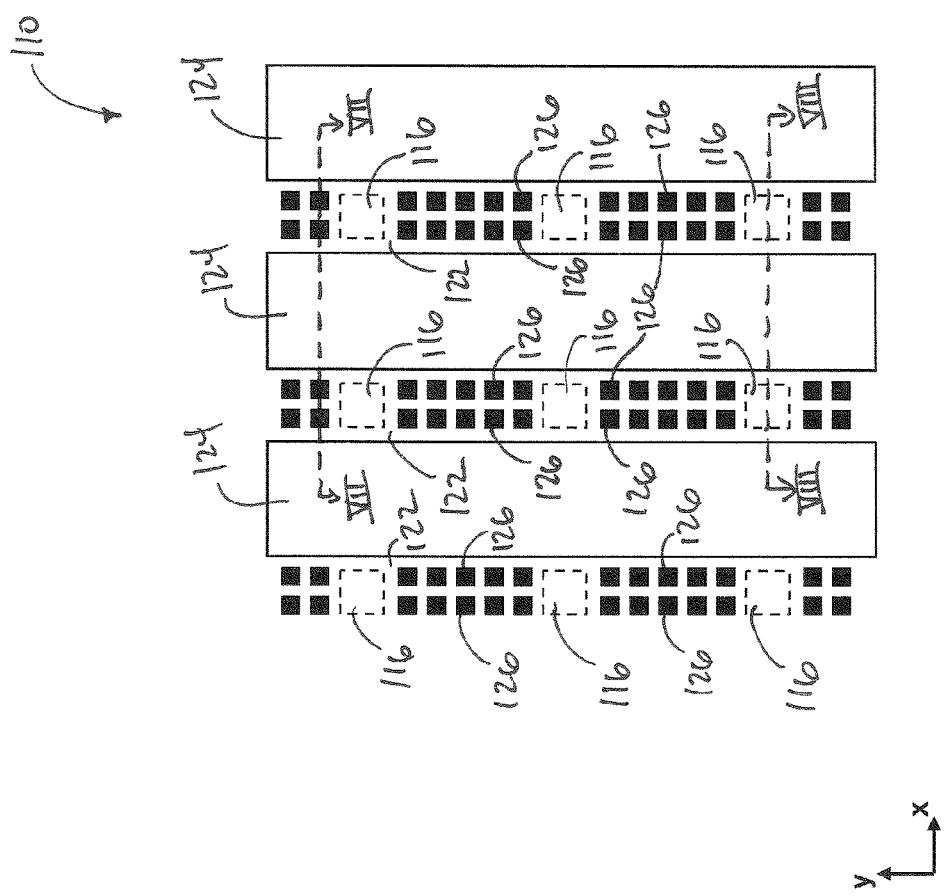
FIG. 6 is an enlarged partial top plan view of a partially completed semiconductor device in accordance with a second preferred embodiment of the present invention.
Figure 8:
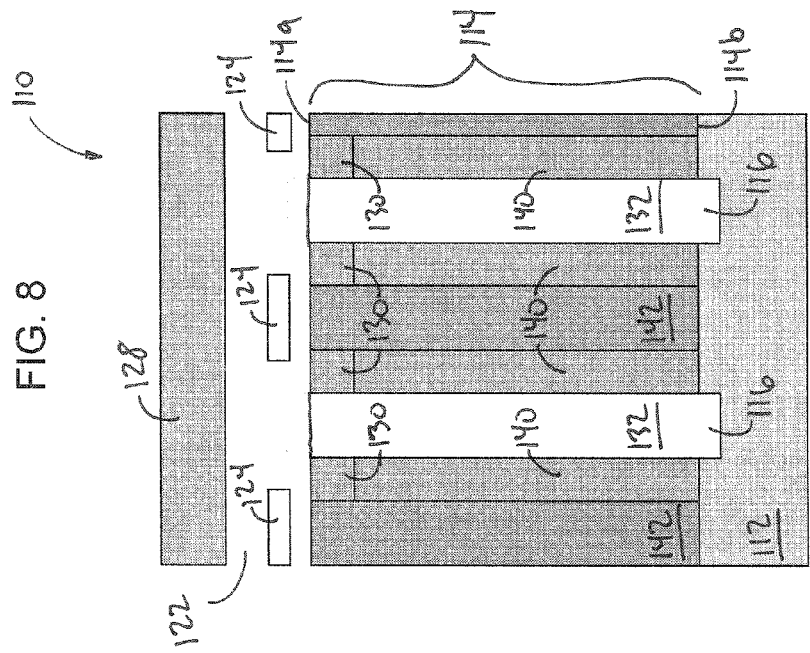
FIG. 8 is an enlarged partial cross-sectional elevational view, taken along line VIII-VIII, of the semiconductor device of FIG. 6 with remaining dielectric layer and metal contact formed thereon.
Figure 7:
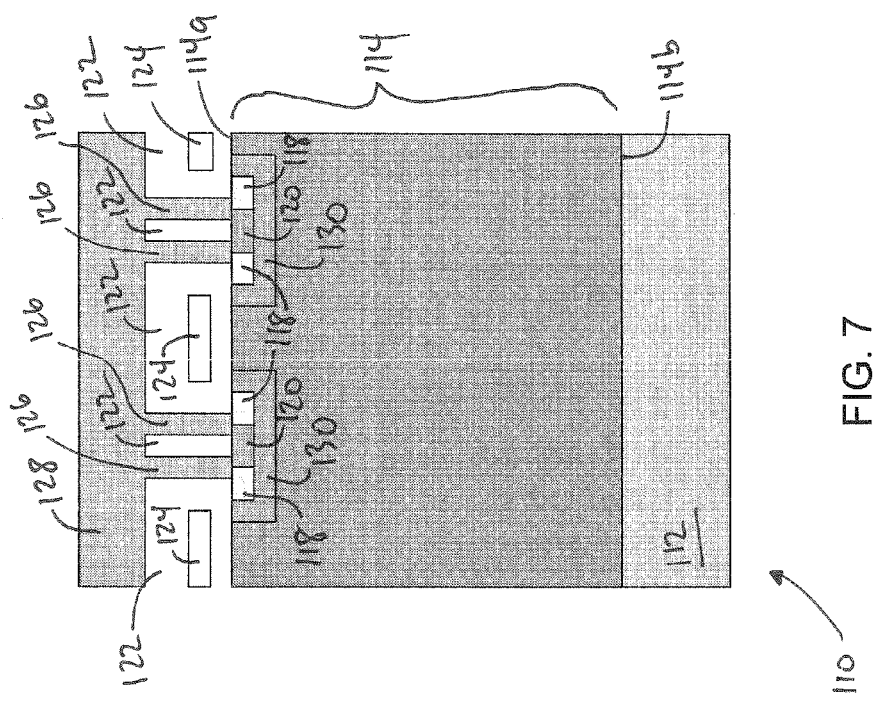
FIG. 7 is an enlarged partial cross-sectional elevational view, taken along line VII-VII, of the semiconductor device of FIG. 6 with remaining dielectric layer and metal contact formed thereon.

FIGS. 6-8 are similar to FIGS. 3-5, however, the gates 124 are relatively smaller in the "x" direction, and therefore the pitch of the trenches 116, as well as the spacing of the contact windows 126, are smaller. Reducing the size of the gates 124 allows for reduction in gate charge. Reducing the pitch of the trenches 116 results in a reduction in on-resistance. The trench pitch may be reduced according to practical capabilities of process technology and as constrained by limits on the width of the second column 142 and doping concentration thereof without departing from the concept of the invention. In addition, any number of contact windows 126 may be used as dictated by device layout without departing from the concept of the present invention.

Devices formed in accordance with the present invention can be used in, for example, automobile electrical systems, power supplies, and power management applications. For example, devices in accordance with the present invention can be employed in LED televisions or displays screens, electric or hybrid cars, LED light bulbs, servers, tablets, uninterruptable power supplies (UPS), and the like.

It will be appreciated by those skilled in the art that changes could be made to the embodiments described above without departing from the broad inventive concepts thereof. It is understood, therefore, that this invention is not limited to the particular embodiments disclosed, but it is intended to cover modifications within the spirit and scope of the present invention as defined by the appended claims.

We claim:

1. A semiconductor device comprising:
    a semiconductor layer having a first main surface and an opposing second main surface, the first main surface defining a plane containing a first axis and a second axis perpendicular to the first axis;
    a first gate disposed proximate the first main surface of the semiconductor layer and extending parallel to the first axis;
    a dielectric layer formed on the first main surface of the semiconductor layer and separating the first gate from the first main surface of the semiconductor layer;
    a first trench formed in the semiconductor layer proximate the first gate and extending from the first main surface of the semiconductor layer toward the second main surface of the semiconductor layer;
    a second trench formed in the semiconductor layer proximate the first gate and extending from the first main surface of the semiconductor layer toward the second main surface of the semiconductor layer, the first and second trenches being spaced apart from one another in a direction parallel to the first axis;
    a first plurality of contact windows formed in the dielectric layer and arranged in a first row extending between the first and second trenches in a direction parallel to the first axis, adjacent contact windows in the first row being separated from one another only by the dielectric layer, each of the first plurality of contact windows exposing a portion of the first main surface of the semiconductor layer, the first row being arranged substantially parallel to the first gate;
    a second plurality of contact windows formed in the dielectric layer and arranged in a second row extending between the first and second trenches parallel to the first row, adjacent contact windows in the second row being separated only by the dielectric layer, each of the second plurality of contact windows exposing a portion of the first main surface of the semiconductor layer, the second row being arranged substantially parallel to the first gate;
    a second gate disposed proximate the first main surface of the semiconductor layer on an opposite side of the first and second trenches from the first gate and extending parallel to the first axis, the first gate, and the first and second rows;
    a third trench formed in the semiconductor layer at an opposite side of the second gate from the first trench, the third trench extending from the first main surface of the semiconductor layer toward the second main surface of the semiconductor layer; and
    a fourth trench formed in the semiconductor layer at an opposite side of the second gate from the second trench, the fourth trench extending from the first main surface of the semiconductor layer toward the second main surface of the semiconductor layer, the third and fourth trenches being spaced apart from one another in a direction parallel to the first axis;
    a third plurality of contact windows formed in the dielectric layer and arranged in a third row extending between the third and fourth trenches in a direction parallel to the first axis, adjacent contact windows in the third row being separated from one another only by the dielectric layer, each of the third plurality of contact windows exposing a portion of the first main surface of the semiconductor layer, the third row being arranged substantially parallel to the second gate; and
    a fourth plurality of contact windows formed in the dielectric layer and arranged in a fourth row extending between the third and fourth trenches parallel to the third row, adjacent contact windows in the fourth row being separated only by the dielectric layer, each of the fourth plurality of contact windows exposing a portion of the first main surface of the semiconductor layer, the fourth row being arranged substantially parallel to the second gate.

2. The semiconductor device of claim 1, wherein the semiconductor layer, between the first and third trenches in a direction parallel to the second axis, includes first columns of a first conductivity type, each first column respectively extending along a sidewall of the first trench and the third trench, and
    a second column of a second conductivity type disposed between the first columns, the second conductivity type being opposite to the first conductivity type.

3. The semiconductor device of claim 1, further comprising:
    a plurality of first doped regions of a first conductivity type formed in the semiconductor layer proximate the first main surface thereof; and
    a plurality of second doped regions of second conductivity type formed in the semiconductor layer proximate first main surface thereof, the second conductivity type being opposite to the first conductivity type.

4. The semiconductor device of claim 3, wherein each of at least one of the first doped regions or the second doped regions is exposed by a respective one of the first and second pluralities of contact windows.

5. The semiconductor device of claim 3, further comprising a third doped region of the second conductivity type formed in the semiconductor layer surrounding the first and second doped regions.

6. A semiconductor device comprising:
    a semiconductor layer having a first main surface and an opposing second main surface, the first main surface defining a plane containing a first axis and a second axis perpendicular to the first axis;
    a first gate disposed proximate the first main surface of the semiconductor layer and extending parallel to the first axis;
    a dielectric layer formed on the first main surface of the semiconductor layer and separating the first gate from the first main surface of the semiconductor layer;

a first trench formed in the semiconductor layer proximate the first gate and extending from the first main surface of the semiconductor layer toward the second main surface of the semiconductor layer;

a second trench formed in the semiconductor layer proximate the first gate and extending from the first main surface of the semiconductor layer toward the second main surface of the semiconductor layer, the first and second trenches being spaced apart from one another in a direction parallel to the first axis;

a first plurality of contact windows formed in the dielectric layer and arranged in a first row extending between the first and second trenches in a direction parallel to the first axis, adjacent contact windows in the first row being separated from one another only by the dielectric layer, each of the first plurality of contact windows exposing a portion of the first main surface of the semiconductor layer, the first row being arranged substantially parallel to the first gate;

a second plurality of contact windows formed in the dielectric layer and arranged in a second row extending between the first and second trenches parallel to the first row, adjacent contact windows in the second row being separated only by the dielectric layer, each of the second plurality of contact windows exposing a portion of the first main surface of the semiconductor layer, the second row being arranged substantially parallel to the first gate;

a third trench formed in the semiconductor layer proximate the first gate and extending from the first main surface of the semiconductor layer toward the second main surface of the semiconductor layer, the second and third trenches being spaced apart from one another in a direction parallel to the first axis;

a third plurality of contact windows formed in the dielectric layer and arranged in a third row extending between the second and third trenches in a direction parallel to the first axis, adjacent contact windows in the third row being separated from one another only by the dielectric layer, each of the third plurality of contact windows exposing a portion of the first main surface of the semiconductor layer, the third row being arranged substantially parallel to the first gate; and a fourth plurality of contact windows formed in the dielectric layer and arranged in a fourth row extending between the second and third trenches parallel to the third row, adjacent contact windows in the fourth row being separated only by the dielectric layer, each of the fourth plurality of contact windows exposing a portion of the first main surface of the semiconductor layer, the fourth row being arranged substantially parallel to the first gate.

7. The semiconductor device of claim 1, further comprising a semiconductor substrate disposed on the second main surface of the semiconductor layer.

8. The semiconductor device of claim 7, wherein the first and second trenches extend at least partially into the substrate.

9. The semiconductor device of claim 1, wherein the first gate is made from polysilicon.

10. The semiconductor device of claim 1, further comprising a metal contact formed on the dielectric layer opposite the first main surface of the semiconductor layer and extending into the first and second pluralities of contact windows.

11. The semiconductor device of claim 1, wherein the first and second trenches are filled with one of a semi-insulating or insulating material.

12. The semiconductor device of claim 6, further comprising:

a plurality of first doped regions of a first conductivity type formed in the semiconductor layer proximate the first main surface thereof; and a plurality of second doped regions of second conductivity type formed in the semiconductor layer proximate first main surface thereof, the second conductivity type being opposite to the first conductivity type.

13. The semiconductor device of claim 12, wherein each of at least one of the first doped regions or the second doped regions is exposed by a respective one of the first and second pluralities of contact windows.

14. The semiconductor device of claim 12, further comprising a third doped region of the second conductivity type formed in the semiconductor layer surrounding the first and second doped regions.

15. The semiconductor device of claim 6, further comprising a semiconductor substrate disposed on the second main surface of the semiconductor layer.

16. The semiconductor device of claim 15, wherein the first and second trenches extend at least partially into the substrate.

17. The semiconductor device of claim 6, wherein the first gate is made from polysilicon.

18. The semiconductor device of claim 6, further comprising a metal contact formed on the dielectric layer opposite the first main surface of the semiconductor layer and extending into the first and second pluralities of contact windows.

19. The semiconductor device of claim 6, wherein the first and second trenches are filled with one of a semi-insulating or insulating material.

* * * * *